(12) United States Patent
Meng et al.

(10) Patent No.: US 11,810,924 B2
(45) Date of Patent: Nov. 7, 2023

(54) DISPLAY SUBSTRATE, METHOD FOR MANUFACTURING DISPLAY SUBSTRATE, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Huijie Meng, Beijing (CN); Erlong Song, Beijing (CN); Hongjun Zhou, Beijing (CN); Cong Liu, Beijing (CN); Feng Wei, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/433,217

(22) PCT Filed: Feb. 25, 2021

(86) PCT No.: PCT/CN2021/077923
§ 371 (c)(1),
(2) Date: Aug. 23, 2021

(87) PCT Pub. No.: WO2021/170042
PCT Pub. Date: Sep. 2, 2021

(65) Prior Publication Data
US 2023/0135580 A1    May 4, 2023

(30) Foreign Application Priority Data

Feb. 28, 2020   (CN) .......................... 202010130700.8

(51) Int. Cl.
*H01L 27/12*    (2006.01)

(52) U.S. Cl.
CPC ...... *H01L 27/1244* (2013.01); *H01L 27/1259* (2013.01)

(58) Field of Classification Search
None
See application file for complete search history.

(56) References Cited

U.S. PATENT DOCUMENTS

2015/0123134 A1   5/2015   Wang et al.
2016/0328062 A1   11/2016  Jin
(Continued)

FOREIGN PATENT DOCUMENTS

| CN | 101217119 A | 7/2008 |
|----|-------------|--------|
| CN | 104777637 A | 7/2015 |

(Continued)

OTHER PUBLICATIONS

PCT/CN2021/077923 international search report and written opinion.
CN 202010130700.8 first office action.

*Primary Examiner* — Bo B Jang
(74) *Attorney, Agent, or Firm* — IPro, PLLC

(57) ABSTRACT

A display substrate, a method for manufacturing the display substrate and a display device are provided. The display substrate includes an Electric Test (ET) region. At least one testing pad and an insulation structure surrounding the testing pad are arranged in the ET region, and a distance between a surface of the insulation structure distal to a base substrate of the display substrate and the base substrate is not greater than a distance between a surface of the testing pad distal to the base substrate and the base substrate.

15 Claims, 3 Drawing Sheets

(56) References Cited

U.S. PATENT DOCUMENTS

2021/0175465 A1    6/2021  Zhou et al.
2021/0200361 A1*  7/2021  Park ..................... G06F 3/0412

FOREIGN PATENT DOCUMENTS

| CN | 206282853 U | | 6/2017 |
|---|---|---|---|
| CN | 109949703 A | | 6/2019 |
| CN | 111341789 A | | 6/2020 |
| KR | 20210082729 | * | 7/2021 |

* cited by examiner

DISPLAY SUBSTRATE, METHOD FOR MANUFACTURING DISPLAY SUBSTRATE, AND DISPLAY DEVICE

CROSS-REFERENCE TO RELATED APPLICATION

This application is the U.S. national phase of PCT Application No.PCT/CN2021/077923 filed on Feb. 25, 2021, which claims a priority of the Chinese patent application No.202010130700.8 filed in China on Feb. 28, 2020, which are incorporated herein by reference in their entireties.

TECHNICAL FIELD

The present disclosure relates to the field of display technology, in particular to a display substrate, a method for manufacturing the display substrate and a display device.

BACKGROUND

In the related art, whether an image is displayed by a display substrate normally is detected through a lighting Electric Test (ET). However, during the lighting ET, there is currently no appropriate scheme about how to ensure an effective electrical connection between a Flexible Printed Circuit (FPC) and a testing pad at a wiring region of the display substrate for the normal test.

SUMMARY

An object of the present disclosure is to provide a display substrate, a method for manufacturing the display substrate and a display device.

In one aspect, the present disclosure provides in some embodiments a display substrate, comprising an ET region, wherein
at least one testing pad and an insulation structure surrounding the testing pad are arranged in the ET region, and a distance between a surface of the insulation structure distal to a base substrate of the display substrate and the base substrate is not greater than a distance between a surface of the testing pad distal to the base substrate and the base substrate,
wherein the display substrate further comprises a display region, the ET region is arranged at periphery of the display region;
the testing pad is configured to be in physical contact with a pad of a flexible circuit board of the display substrate, to perform ET on the display substrate.

In a possible embodiment of the present disclosure, the distance between the surface of the insulation structure distal to the base substrate of the display substrate and the base substrate is smaller than the distance between the surface of the testing pad distal to the base substrate and the base substrate.

In a possible embodiment of the present disclosure, the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, insulation film layers of the display substrate comprise the gate insulation layer, the interlayer insulation layer, the passivation layer, the first planarization layer and the second planarization layer, and the quantity of film layers of the insulation structure is smaller than the total quantity of the insulation film layers of the display substrate.

In a possible embodiment of the present disclosure, in the ET region, an orthogonal projection of the first source/drain metal layer onto the base substrate falls within an orthogonal projection of the second source/drain metal layer onto the base substrate.

In a possible embodiment of the present disclosure, a plurality of testing pads is arranged in the ET region, and adjacent ones of the testing pads are spaced apart from each other.

In a possible embodiment of the present disclosure, the insulation structure comprises the passivation layer and the first planarization layer, or the insulation structure comprises the passivation layer and the second planarization layer.

In a possible embodiment of the present disclosure, the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, insulation film layers of the display substrate comprise the gate insulation layer, the interlayer insulation layer, the passivation layer, the first planarization layer and the second planarization layer, and a thickness of at least one insulation film layer of the insulation structure is smaller than a thickness of the same insulation film layer in another region of the display substrate.

In a possible embodiment of the present disclosure, the testing pad comprises a pattern of a first source/drain metal layer and a pattern of a second source/drain metal layer that are laminated one on another.

In a possible embodiment of the present disclosure, a passivation layer is arranged between the pattern of the first source/drain metal layer and the pattern of the second source/drain metal layer, and the pattern of the first source/drain metal layer is connected to the pattern of the second source/drain metal layer through a via-hole penetrating through the passivation layer.

In a possible embodiment of the present disclosure, the second planarization layer is arranged in merely the display region.

In another aspect, the present disclosure provides in some embodiments a display device including the above-mentioned display substrate.

In yet another aspect, the present disclosure provides in some embodiments a method for manufacturing a display substrate, wherein the display substrate comprises an ET region, and the method comprises:
forming in the ET region at least one testing pad and an insulation structure surrounding the testing pad, wherein a distance between a surface of the insulation structure distal to a base substrate of the display substrate and the base substrate is not greater than a distance between a surface of the testing pad distal to the base substrate and the base substrate.

In a possible embodiment of the present disclosure, the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, and insulation film layers of the display substrate comprise the gate insulation layer, the interlayer insulation layer, the passivation layer, the first planarization layer and the second planarization layer, wherein the forming the insulation structure comprises:

subsequent to forming a pattern of the first planarization layer of the display substrate, removing the first planarization layer in the ET region.

In a possible embodiment of the present disclosure, the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, and insulation film layers of the display substrate comprise the gate insulation layer, the interlayer insulation layer, the passivation layer, the first planarization layer and the second planarization layer, wherein the forming the insulation structure comprises:

subsequent to forming a pattern of the second planarization layer of the display substrate, removing the second planarization layer in the ET region.

DETAILED DESCRIPTION

In order to make the objects, the technical solutions and the advantages of the present disclosure more apparent, the present disclosure will be described hereinafter in details in conjunction with the drawings and embodiments.

For an Active-Matrix Organic Light-Emitting Diode (AMOLED) flexible display panel, whether an image is displayed by a display substrate normally is detected through a lighting ET. During the lighting ET, a pad of an ET FPC is pressed against a testing pad in an ET region of the display substrate.

Figure 1:
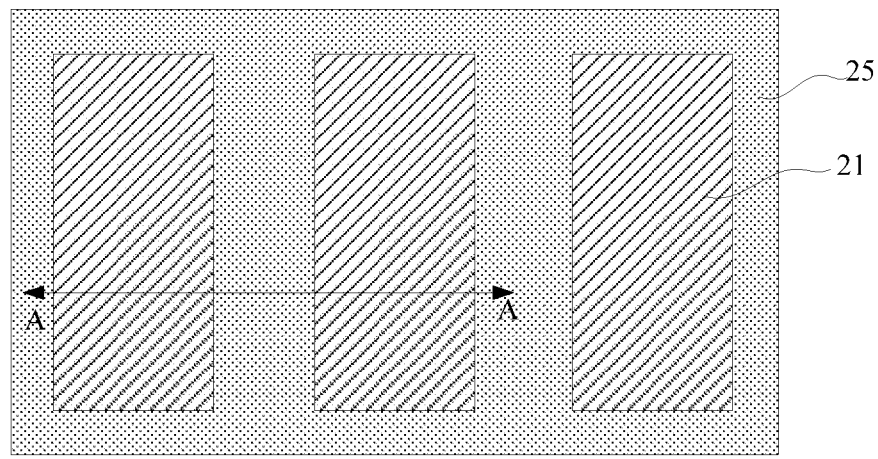
FIG. 1 is a planar view of an ET region in a display substrate in related art.
Figure 2:
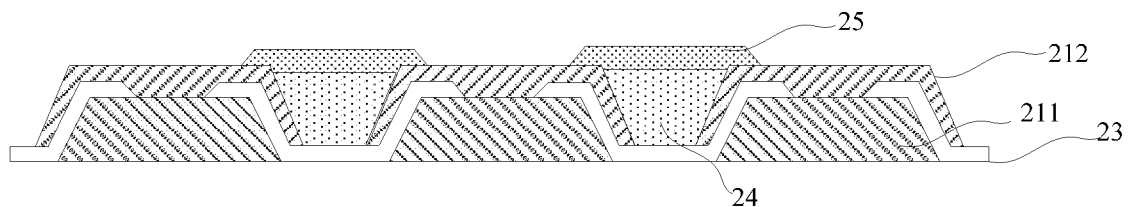
FIG. 2 is a sectional view of the ET region along a line AA in FIG. 1.
Figure 3:
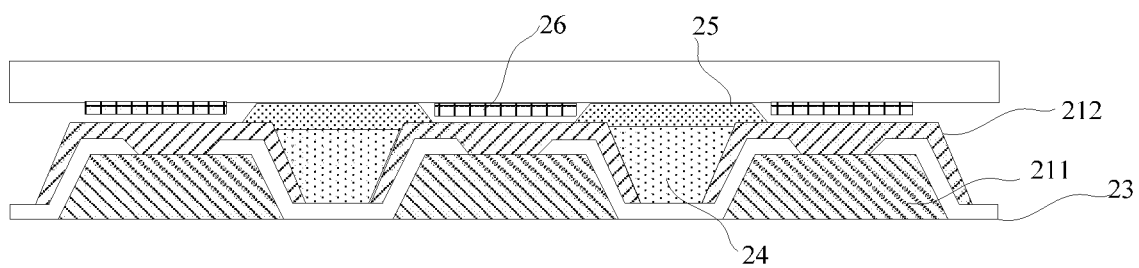
FIG. 3 is a schematic view showing a scenario where a flexible circuit board is pressed against the ET region.

As shown in FIGS. 1 to 3, in order to reduce a resistance of the testing pad 21, the testing pad 21 in the ET region consists of two source/drain metal layers (i.e., a first source/drain metal layer 211 and a second source/drain metal layer 212) laminated one on another, and an insulation structure is arranged in the ET region and surrounds the testing pad 21. The insulation structure includes a passivation layer 23, a first planarization layer 24 and a second planarization layer 25. After the second planarization layer 25 is laminated on the first planarization layer 24, a height of a surface of the insulation structure is greater than a height of a surface of the testing pad 21, i.e., a distance between a surface of the insulation structure distal to a base substrate of the display substrate and the base substrate is greater than a distance between a surface of the testing pad 21 distal to the base substrate and the base substrate. As shown in FIG. 2, the second planarization layer 25 is arranged at an outermost side of the insulation structure, and a distance between a surface of the second planarization layer 25 distal to the base substrate and the base substrate is greater than the distance between the surface of the testing pad 21 distal to the base substrate and the base substrate. As shown in FIG. 3, during the lighting ET, the pad 26 of the flexible circuit board is pressed against the ET region. Because the insulation structure consisting of the second planarization layer 25, the first planarization layer 24 and the passivation layer 23 has a relatively large thickness, it is impossible for the pad 26 of the flexible circuit board to be in contact with the testing pad 21, or there is an imperfect contact between the pad 26 and the testing pad 21. In this case, it is impossible to lighten the display substrate.

An object of the present disclosure is to provide a display substrate, a method for manufacturing the display substrate and a display device, so as to lighten the display substrate normally during the lighting ET for the display substrate.

The present disclosure provides in some embodiments a display substrate, which includes a display region and an ET region surrounding the display region. At least one testing pad and an insulation structure surrounding the testing pad are arranged in the ET region, and a distance between a surface of the insulation structure distal to a base substrate of the display substrate and the base substrate is not greater than a distance between a surface of the testing pad distal to the base substrate and the base substrate.

In the embodiments of the present disclosure, the distance between the surface of the insulation structure distal to the base substrate of the display substrate and the base substrate is not greater than the distance between the surface of the testing pad distal to the base substrate and the base substrate. During the lighting ET, when a pad of a flexible circuit board is pressed against the ET region, a contact between the pad and the testing pad in the ET region is not adversely affected by the insulation structure, i.e., the pad is in full contact with the testing pad, so it is able for the display substrate to be lightened normally during the ET.

The distance between the surface of the insulation structure distal to the base substrate of the display substrate and the base substrate is smaller than or equal to the distance between the surface of the testing pad distal to the base substrate and the base substrate. In this way, a height of a surface of the insulation structure is not greater than a height of a surface of the testing pad. During the lighting ET, when the pad of the flexible circuit board is pressed against the ET region, the contact between the pad and the testing pad in the ET region is not adversely affected by the insulation structure, i.e., the pad is in full contact with the testing pad, so it is able for the display substrate to be lightened normally during the ET.

The display substrate includes an active layer, a gate insulation layer, a gate metal layer, an interlayer insulation layer, a first source/drain metal layer, a passivation layer, a first planarization layer, a second source/drain metal layer and a second planarization layer laminated one on another sequentially in that order in a direction away from the base substrate. Insulation film layers of the display substrate include the gate insulation layer, the interlayer insulation layer, the passivation layer, the first planarization layer and the second planarization layer, and the insulation structure surrounding the testing pad also consists of these insulation film layers. It is able for the distance between the surface of the insulation structure distal to the base substrate of the display substrate and the base substrate to be not greater than the distance between the surface of the testing pad distal to the base substrate and the base substrate through various ways. For example, all or a part of an insulation film layer of the insulation structure is removed, or all or a part of multiple insulation film layers of the insulation structure is removed, so that the distance between the surface of the insulation structure distal to the base substrate of the display substrate and the base substrate is not greater than the distance between the surface of the testing pad distal to the base substrate and the base substrate.

In the embodiments of the present disclosure, the quantity of insulation film layers of the insulation structure may be smaller than the total quantity of the insulation film layers of the display substrate.

Figure 4:
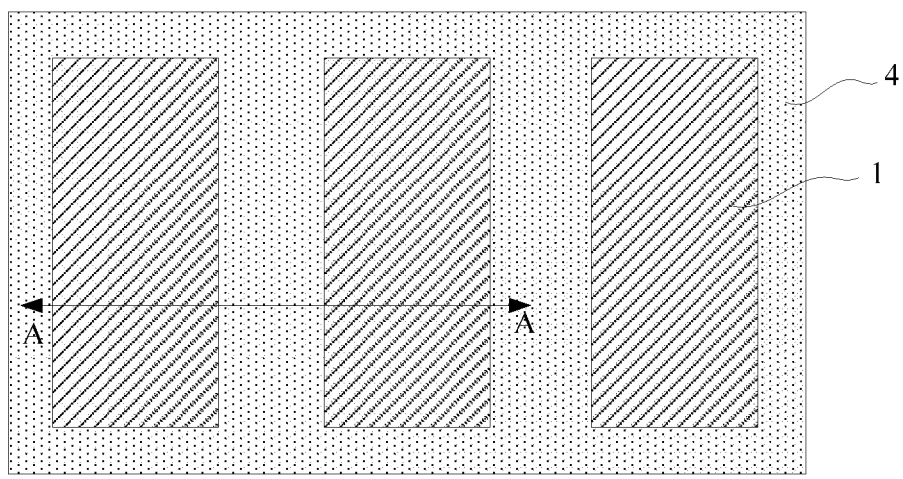
FIG. 4 is a planar view of an ET region in a display substrate according to an embodiment of the present disclosure.
Figure 5:
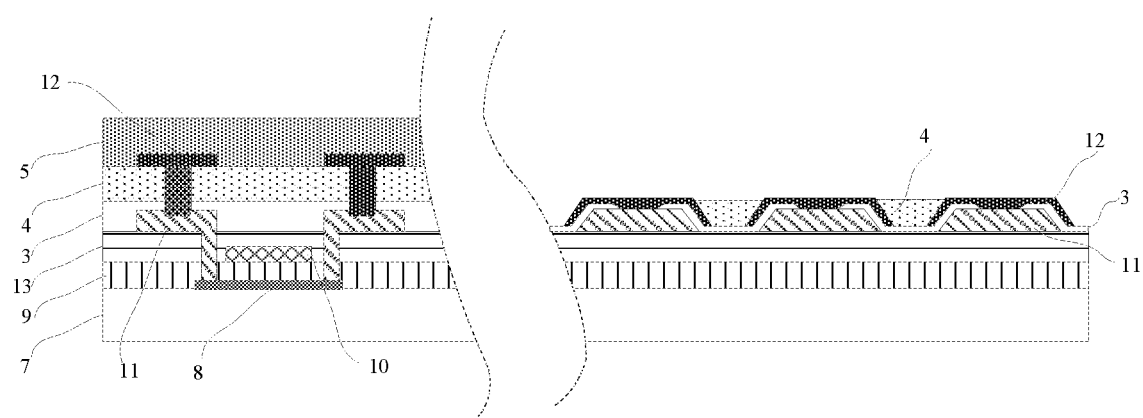
FIG. 5 is a sectional view of the ET region along a line AA in FIG. 4.
Figure 6:
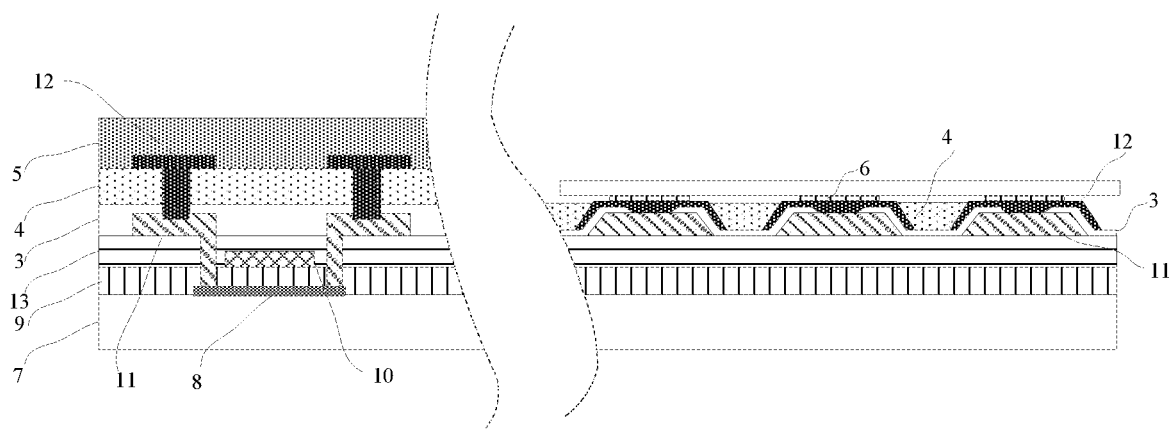
FIG. 6 is a schematic view showing a scenario where a flexible circuit board is pressed against the ET region according to an embodiment of the present disclosure.

In a possible embodiment of the present disclosure, as shown in FIGS. 4 and 5, a left half portion in FIG. 5 represents the display region of the display substrate. The display substrate includes an active layer 8, a gate insulation layer 9, a gate metal layer 10, an interlayer insulation layer 13, a first source/drain metal layer 11, a passivation layer 3, a first planarization layer 4, a second source/drain metal layer 12 and a second planarization layer 5 arranged on the base substrate 7. A right half portion in FIG. 5 represents the ET region of the display substrate. As shown in FIGS. 4 and 5, the second planarization layer 5 is removed in the ET region of the display substrate, and an insulation film layer at an outermost side of the insulation structure distal to the base substrate is the first planarization layer 4, so that the height of the surface of the insulation structure is smaller than the height of the surface of the testing pad, as shown in FIG. 6. During the lighting ET, when a pad 6 of the flexible circuit board is pressed against the ET region, the insulation structure consisting of the first planarization layer 4 and the passivation layer 3 has a relatively small thickness, so the contact between the pad 6 of the flexible circuit board and the testing pad 1 is not adversely affected by the insulation structure, i.e., the pad 6 of the flexible circuit board is in full contact with the testing pad 1. As a result, it is able to lighten the display substrate normally during the lighting ET.

In the embodiments of the present disclosure, in order to provide the testing pad with a relatively small resistance, the testing pad 1 is formed by the first source/drain metal layer 11 and the second source/drain metal layer 12 laminated one on another, the passivation layer 3 is arranged between the first source/drain metal layer 11 and the second source/drain metal layer 12, and the first source/drain metal layer 11 is connected to the second source/drain metal layer 12 through a via-hole penetrating through the passivation layer 3.

After the formation of a pattern of the second planarization layer 5 in the display region, the second planarization layer 5 in the ET region is removed through a dedicated patterning process. In addition, the second planarization layer 5 in the ET region is removed simultaneously through a single patterning process while forming the pattern of the second planarization layer 5 in the display region, so as to reduce the quantity of patterning processes for manufacturing the display substrate, thereby to reduce the manufacture cost thereof.

Figure 7:
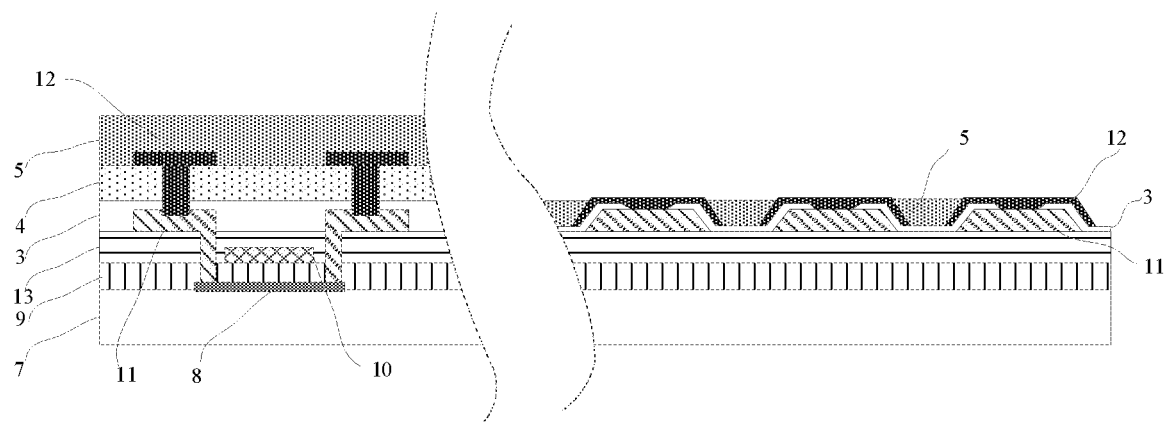
FIG. 7 is a sectional view of the ET region in the display substrate according to another embodiment of the present disclosure.
Figure 8:
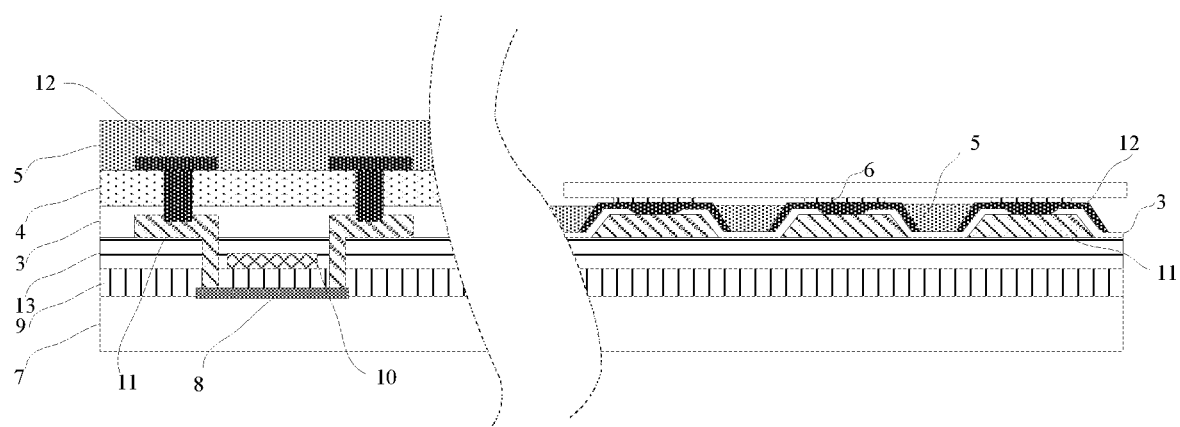
FIG. 8 is a schematic view showing the scenario where the flexible circuit board is pressed against the ET region according to another embodiment of the present disclosure.

In another possible embodiment of the present disclosure, as shown in FIG. 7, a left half portion in FIG. 7 represents the display region of the display substrate. The display substrate includes an active layer 8, a gate insulation layer 9, a gate metal layer 10, an interlayer insulation layer 13, a first source/drain metal layer 11, a passivation layer 3, a first planarization layer 4, a second source/drain metal layer 12 and a second planarization layer 5 arranged on the base substrate 7. A right half portion in FIG. 7 represents the ET region of the display substrate. As shown in FIG. 7, the first planarization layer 4 is removed in the ET region of the display substrate, and an insulation film layer at an outermost side of the insulation structure distal to the base substrate is the second planarization layer 5, so that the height of the surface of the insulation structure is smaller than the height of the surface of the testing pad, as shown in FIG. 8. During the ET, when the pad 6 of the flexible circuit board is pressed against the ET region, the insulation structure consisting of the second planarization layer 5 and the passivation layer 3 has a relatively small thickness, so the contact between the pad 6 of the flexible circuit board and the testing pad 1 is not adversely affected by the insulation structure, i.e., the pad 6 of the flexible circuit board may be in full contact with the testing pad 1. As a result, it is able to lighten the display substrate normally during the ET.

In the embodiments of the present disclosure, in order to provide the testing pad with a relatively small resistance, the testing pad 1 is formed by the first source/drain metal layer 11 and the second source/drain metal layer 12 laminated one on another, the passivation layer 3 is arranged between the first source/drain metal layer 11 and the second source/drain metal layer 12, and the first source/drain metal layer 11 is connected to the second source/drain metal layer 12 through a via-hole penetrating through the passivation layer 3.

After the formation of a pattern of the first planarization layer 4 in the display region, the first planarization layer 4 in the ET region is removed through a dedicated patterning process. In addition, the first planarization layer 4 in the ET region is removed simultaneously through a single patterning process while forming the pattern of the first planarization layer 4 in the display region, so as to reduce the quantity of patterning process for manufacturing the display substrate, thereby to reduce the manufacture cost thereof.

In another possible embodiment of the present disclosure, the insulation film layers of the display substrate include the gate insulation layer, the interlayer insulation layer, the passivation layer, the first planarization layer and the second planarization layer, and a thickness of at least one insulation film layer of the insulation structure is smaller than a thickness of a same insulation film layer in the other region of the display substrate.

The quantity of the insulation film layers of insulation structure in the ET region is equal to the total quantity of the insulation film layers of the display substrate, but a thickness of each of at least one of insulation film layers, or each of the insulation film layers, is smaller than a thickness of a same insulation film layer in the other region of the display substrate. In this way, the distance between the surface of the insulation structure distal to the base substrate of the display substrate and the base substrate is not greater than the distance between the surface of the testing pad distal to the base substrate and the base substrate. In a possible embodiment of the present disclosure, the insulation structure consists of the insulation film layers.

For example, a thickness of the first planarization layer in the ET region is smaller than a thickness of the first planarization layer in the other region of the display substrate, or a thickness of the second planarization layer in the ET region is smaller than a thickness of the second planarization layer in the other region of the display substrate, or a thickness of the passivation layer in the ET region is smaller than a thickness of the passivation layer in the other region of the display substrate.

When the thickness of the first planarization layer in the ET region is smaller than the thickness of the first planarization layer in the other region of the display substrate, the thickness of the first planarization layer in the ET region is reduced during the formation of the pattern of the first planarization layer in the other region; when the thickness of the second planarization layer in the ET region is smaller than the thickness of the second planarization layer in the other region of the display substrate, the thickness of the second planarization layer in the ET region is reduced during the formation of the pattern of the second planarization layer in the other region; when the thickness of the passivation layer in the ET region is smaller than the thickness of the passivation layer in the other region of the display substrate, the thickness of the passivation layer in the ET region is reduced during the formation of the pattern of the passivation layer in the other region, and so on.

When the thickness of the first planarization layer in the ET region is smaller than the thickness of the first planarization layer in the other region of the display substrate, the thickness of the first planarization layer in the ET region is reduced after the formation of the pattern of the first planarization layer in the other region; when the thickness of the second planarization layer in the ET region is smaller than the thickness of the second planarization layer in the other region of the display substrate, the thickness of the second planarization layer in the ET region is reduced after the formation of the pattern of the second planarization layer in the other region; when the thickness of the passivation layer in the ET region is smaller than the thickness of the passivation layer in the other region of the display substrate, the thickness of the passivation layer in the ET region is reduced after the formation of the pattern of the passivation layer in the other region, and so on.

In the embodiments of the present disclosure, in order to provide the testing pad with a relatively small resistance, the testing pad consists of the first source/drain metal layer and the second source/drain metal layer laminated one on another.

The present disclosure further provides in some embodiments a display device including the above-mentioned display substrate. The display device includes, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device includes but not limited to, display, mobile phone, flat-panel computer, television, wearable electronic device or navigator.

The display device is any product or member having a display function, e.g., television, display, digital photo frame, mobile phone or tablet computer. The display device further includes a flexible circuit board, a printed circuit board and a back plate.

The present disclosure further provides in some embodiments a method for manufacturing a display substrate. The display substrate includes a display region and an ET region surrounding the display region. The method includes forming at least one testing pad and an insulation structure surrounding the testing pad in the ET region. A distance between a surface of the insulation structure distal to a base substrate of the display substrate and the base substrate is not greater than a distance between a surface of the testing pad distal to the base substrate and the base substrate.

In the embodiments of the present disclosure, the distance between the surface of the insulation structure distal to the base substrate of the display substrate and the base substrate is not greater than the distance between the surface of the testing pad distal to the base substrate and the base substrate. During the lighting ET, when a pad of a flexible circuit board is pressed against the ET region, a contact between the pad and the testing pad in the ET region is not adversely affected by the insulation structure, i.e., the pad is in full contact with the testing pad, so it is able for the display substrate to be lightened normally during the ET.

The distance between the surface of the insulation structure distal to the base substrate of the display substrate and the base substrate is smaller than or equal to the distance between the surface of the testing pad distal to the base substrate and the base substrate. In this way, a height of a surface of the insulation structure is not greater than a height of a surface of the testing pad. During the lighting ET, when the pad of the flexible circuit board is pressed against the ET region, the contact between the pad and the testing pad in the ET region is not adversely affected by the insulation structure, i.e., the pad is in full contact with the testing pad, so it is able for the display substrate to be lightened normally during the ET.

The display substrate includes an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate. Insulation film layers of the display substrate include the gate insulation layer, the interlayer insulation layer, the passivation layer, the first planarization layer and the second planarization layer, and the insulation structure surrounding the testing pad also consists of these insulation film layers. It is able for the distance between the surface of the insulation structure distal to the base substrate of the display substrate and the base substrate to be not greater than the distance between the surface of the testing pad distal to the base substrate and the base substrate through various ways. For example, all or a part of an insulation film layer of the insulation structure is removed, or all or a part of multiple insulation film layers of the insulation structure is removed, so that the distance between the surface of the insulation structure distal to the base substrate of the display substrate and the base substrate is not greater than the distance between the surface of the testing pad distal to the base substrate and the base substrate.

In the embodiments of the present disclosure, the quantity of insulation film layers of the insulation structure is smaller than the total quantity of the insulation film layers of the display substrate.

In a possible embodiment of the present disclosure, as shown in FIGS. 4 and 5, a left half portion in FIG. 5 represents the display region of the display substrate. The display substrate includes an active layer 8, a gate insulation layer 9, a gate metal layer 10, an interlayer insulation layer 13, a first source/drain metal layer 11, a passivation layer 3, a first planarization layer 4, a second source/drain metal layer 12 and a second planarization layer 5 arranged on the base substrate 7. A right half portion in FIG. 5 represents the ET region of the display substrate. As shown in FIGS. 4 and 5, the second planarization layer 5 is removed in the ET region of the display substrate, and an insulation film layer at an outermost side of the insulation structure distal to the base substrate is the first planarization layer 4, so that the height of the surface of the insulation structure is smaller than the height of the surface of the testing pad, as shown in FIG. 6. During the lighting ET, when a pad 6 of the flexible circuit board is pressed against the ET region, the insulation structure consisting of the first planarization layer 4 and the passivation layer 3 has a relatively small thickness, so the contact between the pad 6 of the flexible circuit board and the testing pad 1 is not adversely affected by the insulation structure, i.e., the pad 6 of the flexible circuit board may be in full contact with the testing pad 1. As a result, it is able to lighten the display substrate normally during the ET.

In the embodiments of the present disclosure, in order to provide the testing pad with a relatively small resistance, the testing pad 1 is formed by the first source/drain metal layer 11 and the second source/drain metal layer 12 laminated one on another, the passivation layer 3 is arranged between the first source/drain metal layer 11 and the second source/drain metal layer 12, and the first source/drain metal layer 11 is connected to the second source/drain metal layer 12 through a via-hole penetrating through the passivation layer 3.

After the formation of a pattern of the second planarization layer 5 in the display region, the second planarization layer 5 in the ET region is removed through a dedicated patterning process. In addition, the second planarization layer 5 in the ET region is removed simultaneously through a single patterning process while forming the pattern of the second planarization layer 5 in the display region, so as to reduce the quantity of patterning process for manufacturing the display substrate, thereby to reduce the manufacture cost thereof.

In a possible embodiment of the present disclosure, the forming the insulation structure includes:
  subsequent to forming a pattern of the first planarization layer of the display substrate, removing the first planarization layer in the ET region.

In another possible embodiment of the present disclosure, as shown in FIG. 7, a left half portion in FIG. 7 represents the display region of the display substrate. The display substrate includes an active layer 8, a gate insulation layer 9, a gate metal layer 10, an interlayer insulation layer 13, a first source/drain metal layer 11, a passivation layer 3, a first planarization layer 4, a second source/drain metal layer 12 and a second planarization layer 5 arranged on the base substrate 7. A right half portion in FIG. 7 represents the ET region of the display substrate. As shown in FIG. 7, the first planarization layer 4 is removed in the ET region of the display substrate, and an insulation film layer at an outermost side of the insulation structure distal to the base substrate is the second planarization layer 5, so that the height of the surface of the insulation structure is smaller than the height of the surface of the testing pad, as shown in FIG. 8. During the lighting ET, when the pad 6 of the flexible circuit board is pressed against the ET region, the insulation structure consisting of the second planarization layer 5 and the passivation layer 3 has a relatively small thickness, so the contact between the pad 6 of the flexible circuit board and the testing pad 1 is not adversely affected by the insulation structure, i.e., the pad 6 of the flexible circuit board is in full contact with the testing pad 1. As a result, it is able to lighten the display substrate normally during the ET.

In the embodiments of the present disclosure, in order to provide the testing pad with a relatively small resistance, the testing pad 1 is formed by the first source/drain metal layer 11 and the second source/drain metal layer 12 laminated one on another, the passivation layer 3 is arranged between the first source/drain metal layer 11 and the second source/drain metal layer 12, and the first source/drain metal layer 11 is connected to the second source/drain metal layer 12 through a via-hole penetrating through the passivation layer 3.

After the formation of a pattern of the first planarization layer 4 in the display region, the first planarization layer 4 in the ET region is removed through a dedicated patterning process. In addition, the first planarization layer 4 in the ET region is removed simultaneously through a single patterning process while forming the pattern of the first planarization layer 4 in the display region, so as to reduce the quantity of patterning process for manufacturing the display substrate, thereby to reduce the manufacture cost thereof.

In a possible embodiment of the present disclosure, the forming the insulation structure includes:
  subsequent to forming a pattern of the second planarization layer of the display substrate, removing the second planarization layer in the ET region.

It should be further appreciated that, the above embodiments have been described in a progressive manner, and the same or similar contents in the embodiments have not been repeated, i.e., each embodiment has merely focused on the difference from the others. Especially, the embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner. The above embodiments are for illustrative purposes only, but the present disclosure is not limited thereto. A person skilled in the art may make further modifications and improvements without departing from the principle of the present disclosure, and these modifications and improvements shall also fall within the scope of the present disclosure. Therefore, a protection scope of the present disclosure is defined by the claims.

What is claimed is:

1. A display substrate, comprising an Electric Test (ET) region, wherein
  at least one testing pad and an insulation structure surrounding the testing pad are arranged in the ET region, and a distance between a surface of the insulation structure distal to a base substrate of the display substrate and the base substrate is not greater than a distance between a surface of the testing pad distal to the base substrate and the base substrate, wherein the display substrate further comprises a display region, the ET region is arranged at periphery of the display region;

the testing pad is configured to be in physical contact with a pad of a flexible circuit board of the display substrate, to perform ET on the display substrate;

wherein the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, insulation film layers of the display substrate comprise the gate insulation layer, the interlayer insulation layer, the passivation layer, the first planarization layer and the second planarization layer, and a quantity of film layers of the insulation structure is smaller than a quantity of the insulation film layers of the display substrate;

wherein the insulation structure comprises the passivation layer and the first planarization layer, or the insulation structure comprises the passivation layer and the second planarization layer.

2. The display substrate according to claim 1, wherein the distance between the surface of the insulation structure distal to the base substrate of the display substrate and the base substrate is smaller than the distance between the surface of the testing pad distal to the base substrate and the base substrate.

3. The display substrate according to claim 1, wherein in the ET region, an orthogonal projection of the first source/drain metal layer onto the base substrate falls within an orthogonal projection of the second source/drain metal layer onto the base substrate.

4. The display substrate according to claim 1, wherein a plurality of testing pads including the at least one testing pad is arranged in the ET region, and adjacent ones of the testing pads are spaced apart from each other.

5. The display substrate according to claim 1, wherein a thickness of at least one insulation film layer of the insulation structure is smaller than a thickness of a same insulation film layer in another region of the display substrate.

6. The display substrate according to claim 5, wherein the second planarization layer is arranged in merely the display region.

7. The display substrate according to claim 1, wherein the testing pad comprises a pattern of a first source/drain metal layer and a pattern of a second source/drain metal layer that are laminated one on another.

8. The display substrate according to claim 7, wherein a passivation layer is arranged between the pattern of the first source/drain metal layer and the pattern of the second source/drain metal layer, and the pattern of the first source/drain metal layer is connected to the pattern of the second source/drain metal layer through a via-hole penetrating through the passivation layer.

9. A display device, comprising the display substrate according to claim 1.

10. The display device according to claim 9, wherein the distance between the surface of the insulation structure distal to the base substrate of the display substrate and the base substrate is smaller than the distance between the surface of the testing pad distal to the base substrate and the base substrate.

11. The display device according to claim 9, wherein in the ET region, an orthogonal projection of the first source/drain metal layer onto the base substrate falls within an orthogonal projection of the second source/drain metal layer onto the base substrate.

12. The display device according to claim 9, wherein a plurality of testing pads including the at least one testing pad is arranged in the ET region, and adjacent ones of the testing pads are spaced apart from each other.

13. The display device according to claim 9, wherein a thickness of at least one insulation film layer of the insulation structure is smaller than a thickness of a same insulation film layer in another region of the display substrate.

14. A method for manufacturing a display substrate, wherein the display substrate comprises an Electric Test (ET) region, and the method comprises:

forming in the ET region at least one testing pad and an insulation structure surrounding the testing pad, wherein a distance between a surface of the insulation structure distal to a base substrate of the display substrate and the base substrate is not greater than a distance between a surface of the testing pad distal to the base substrate and the base substrate;

wherein the display substrate comprises an active layer, a gate insulation layer, a gate metal layer, an interlayer insulation layer, a first source/drain metal layer, a passivation layer, a first planarization layer, a second source/drain metal layer and a second planarization layer that are arranged sequentially in that order in a direction away from the base substrate, and insulation film layers of the display substrate comprise the gate insulation layer, the interlayer insulation layer, the passivation layer, the first planarization layer and the second planarization layer, wherein the forming the insulation structure comprises:

subsequent to forming a pattern of the first planarization layer of the display substrate, removing the first planarization layer in the ET region.

15. The method according to claim 14, wherein the forming the insulation structure comprises:

subsequent to forming a pattern of the second planarization layer of the display substrate, removing the second planarization layer in the ET region.

\* \* \* \* \*